United States Patent [19]
Garagnon

[11] Patent Number: 5,032,776
[45] Date of Patent: Jul. 16, 1991

[54] ATTENUATION FILTER

[75] Inventor: Gary B. Garagnon, Belmont, Calif.

[73] Assignee: Unisys Corp., Detroit, Mich.

[21] Appl. No.: 534,225

[22] Filed: Jun. 7, 1990

Related U.S. Application Data

[63] Continuation of Ser. No. 293,534, Nov. 10, 1988, abandoned, which is a continuation of Ser. No. 20,620, Mar. 3, 1987, abandoned.

[51] Int. Cl.⁵ .............................................. G05B 5/01
[52] U.S. Cl. ..................................... 318/611; 318/615
[58] Field of Search ............. 318/603, 611, 615, 617, 318/619, 620, 621, 622, 623, 652, 667, 561

[56] References Cited

U.S. PATENT DOCUMENTS

| | | | |
|---|---|---|---|
| 4,355,266 | 10/1982 | Pearson | 318/85 |
| 4,518,935 | 5/1985 | Van Roermund | 333/174 X |
| 4,578,723 | 3/1986 | Betts et al. | 318/677 X |
| 4,594,622 | 6/1986 | Wallis | 318/561 X |
| 4,616,276 | 10/1986 | Workman | 360/77.04 |
| 4,642,541 | 2/1987 | El-Sadi | 318/620 |
| 4,788,608 | 11/1988 | Tsujisawa | 360/78.13 X |

Primary Examiner—Bentsu Ro
Attorney, Agent, or Firm—John J. McCormack; Mark T. Starr

[57] ABSTRACT

Disclosed is a disk drive servo system including a "switched-capacitor" digital filter means adapted to attenuate resonant vibration and enhance system stability and position loop control.

11 Claims, 10 Drawing Sheets eg.1: $C/R = \dfrac{KA + Kf(s)}{1 + Kf(s)}$

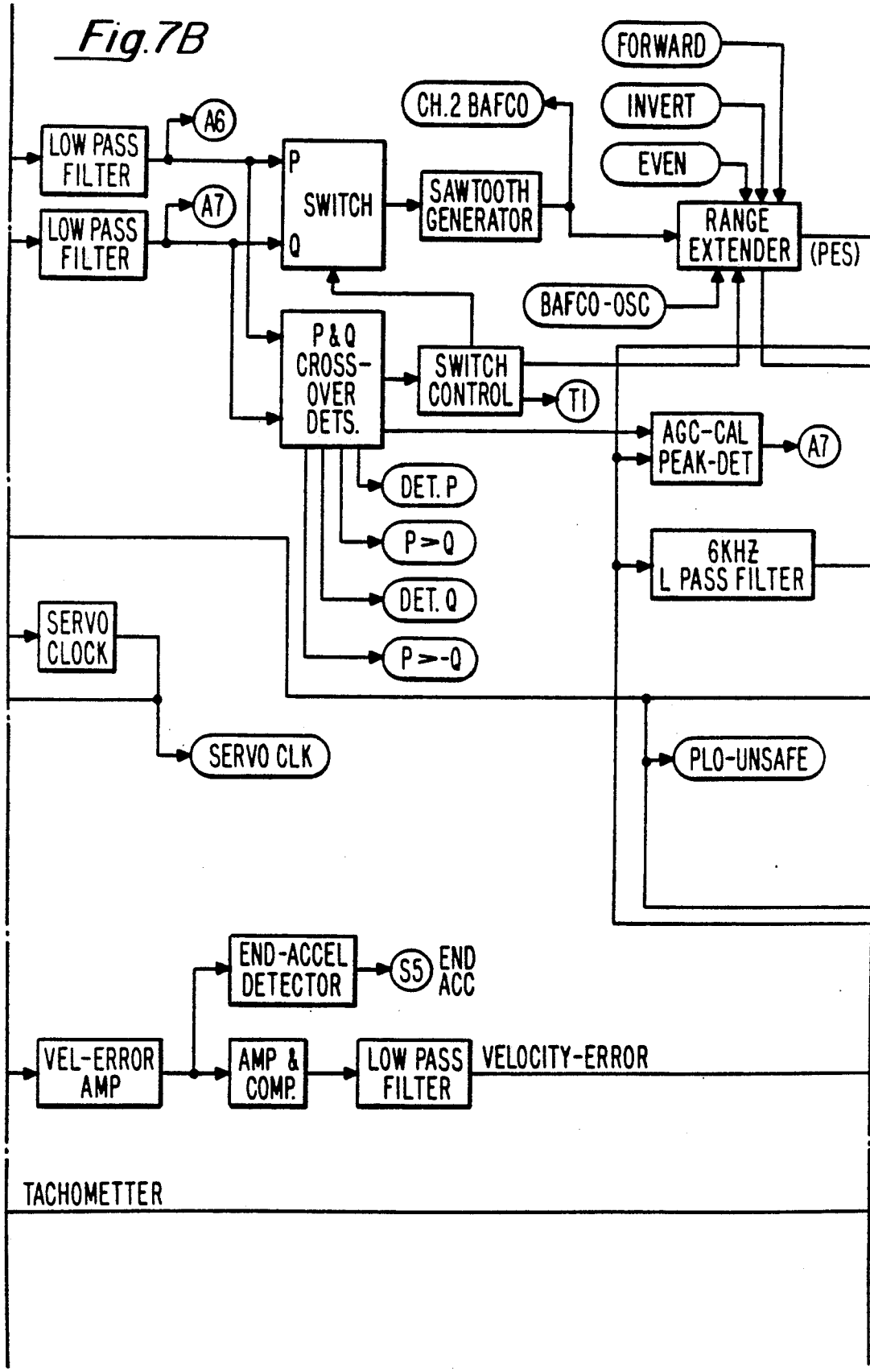

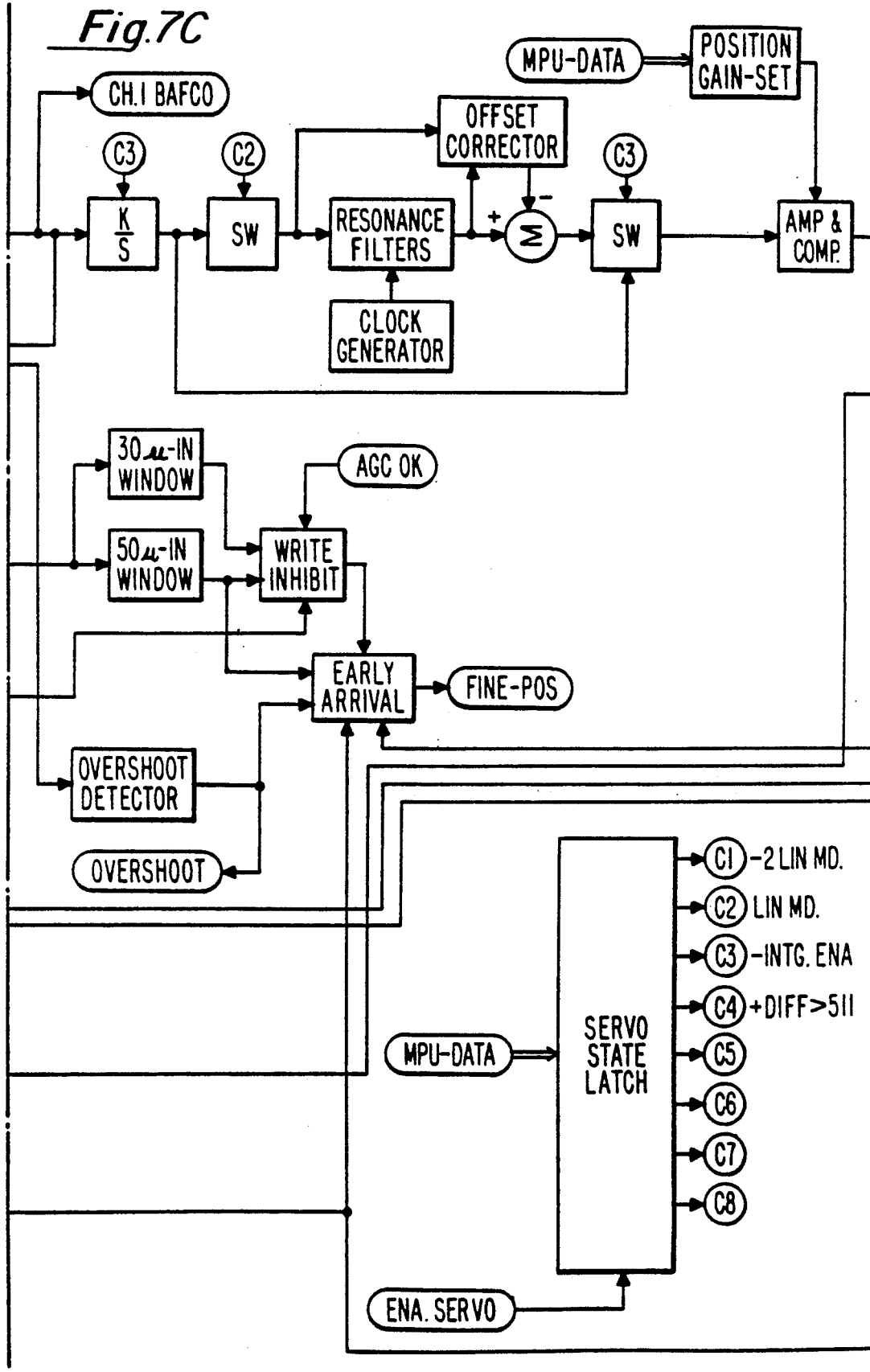

ATTENUATION FILTER

This application is a continuation of U.S. application Ser. No. 07/293,534, filed Nov. 10, 1988, which is a continuation of Ser. No. 07/020,620, filed Mar. 3, 1987, both now abandoned.

The following relates to magnetic disk recording systems and controls therefor. More particularly it relates to application of a prescribed resonance-attenuation filter in a feedback control system therefor.

BACKGROUND, FEATURES

In a magnetic disk drive, a position servo system is apt to be shaken by the operation of the head actuator (during "track-seek" and/or "track following" operations), as well as by external forces such as wind. That is, in a magnetic disk drive position servo system, mechanical driving components can exhibit various resonances which de-stabilize, or impair, track following. As a result, servo operation can readily be upset by such vibration, especially at resonance points. Such resonances in the disk drive can cause the servo to become unstable. In general, oscillations can occur which severely impair or even destroy the control functions of the positioning servo loop. An object of this invention is to provide an improved servo loop including a resonance-attenuation filter which stabilizes and otherwise improves the positioning servo system in the presence of known mechanical resonances.

More particularly the invention prescribes a novel "switched capacitor" digital filter means provided in a "multiple-notch-filter" to attenuate resonances. This is preferably used as improved feedback control means and in particular improved filter means to attentuate prescribed band resonances.

In a preferred embodiment, a signal processing filter is taught which may be provided using off-the-shelf "switched capacitor filter" means. In the novel filter "second-order, low-pass" sections are summed with "second order, high-pass" sections to form a "fourth-order, double-notch filter". Such a filter is preferably arranged to have a depth (dB, or gain magnitude) adequate to attenuate one of a group of mechanical resonances which typically appear in a disk drive system. The filter may be set so that its complex poles and zeroes provide for minimum phase shift and maximum attenuation. This is as opposed to conventional filters featuring one or several single notch-filter means, each adapted to address only a single mechanical resonance frequency—being subject to the well known problems of frequency variance or filter variance whereby the filtering action can shift due to temperature and component tolerances.

Without such a filter, workers will appreciate that resonances in a disk drive system can render the servo instable, with oscillations causing the positioning loop to effectively lose control. Thus, our novel filter is characterized as improving the stability of a position servo system in the presence of a band of known mechanical resonances.

As workers know, for these and similar problems, the prior art has used analog filters which required capacitors whose operative values are subject to change with temperature and component tolerances; such are of questionable reliability and stability. Also more than one notch frequency was difficult to implement since component tolerances varied unpredictabley and could have an adverse effect on the phase shift of the filter.

The prior art has used single analog notch filters for each such resonance and these were subject to large tolerance variations; and they not only required multiple OP-amps but also external circuit capacitors to implement more than one notch, whereas with the invention multiple notches are accommodated in a single commercially-available device. Typically, such analog filter systems required one OP amplifier for each "notch"—whereas, with our invention, a plurality of notches can be handled within a single device. Thus, we characterized out invention as a "multiple-notch" filter, operating in a digital rather than analog manner.

As another preferred feature, the subject filter exhibits a local feedback loop adapted to correct any DC offset resulting from the switched capacitor means. As yet another feature, frequency tolerance is determined according to the stability of a master clock source, such as a crystal oscillator.

In sum, the subject filter can be used to attenuate several resonances across a multi-notch band and thus stabilize a closed-loop servo system. Such a filter can provide a prescribed gain reduction (e.g., 10+ DB or more) in the region of known head-arm resonance frequencies (e.g., about 3 to 5 $KH_z$). Our filter is designed to provide minimum phase shift at the servo "open loop" gain crossover frequency. Such a filter is preferably implemented as a "fourth-order, elliptic-notch filter" means.

In any closed-loop servo system, one must take care that the filter phase shift does not combine with the phase shift of the overall drive, and thus compromise stability.

Therefore, my desired filter should operate so that its phase shift is a minimum at the open loop gain crossover frequency of the position servo system.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements:

FIGS. 7A to 7D show a schematic block diagram of a rather complete disk drive servo system using the embodiment of present invention.

DESCRIPTION OF THE PREFERRED EMBODIMENT

General description, background

FIGS. 1-5 schematically illustrate resonance attenuation filter means constructed according to principles of this invention. This, and other means discussed herein, will generally be understood as constructed and operating as presently known in the art, except where otherwise specified. And, except as otherwise specified, all materials, methods and devices and apparatus herein will be understood as implemented by known expedients according to present good practice.

Figure 1:
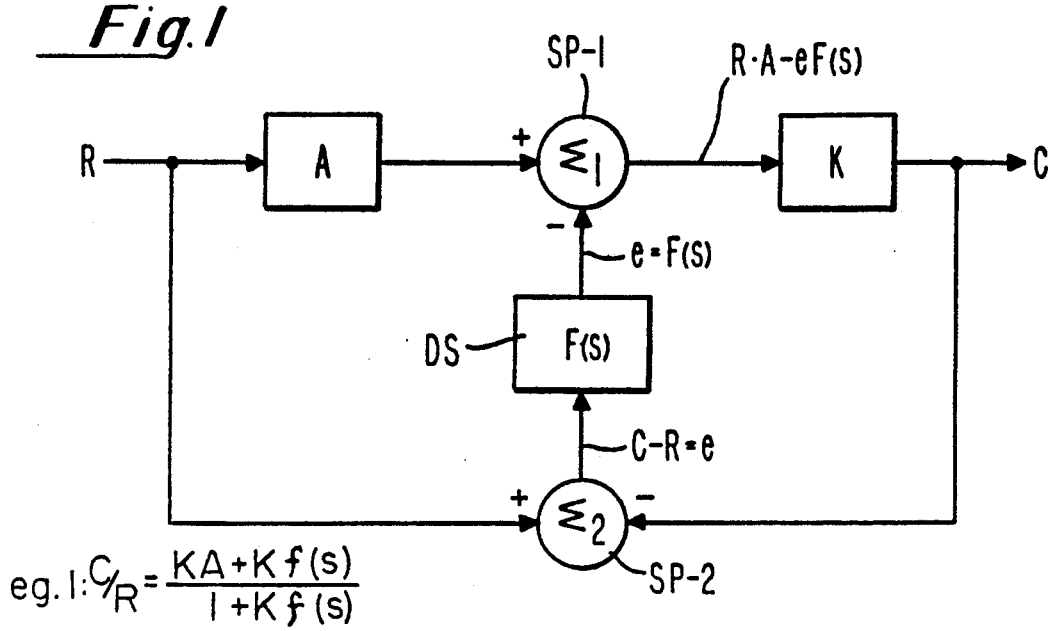
FIG. 1 shows a functional schematic idealized block diagram of an embodiment with resonance attenuation notch-filter.

A preferred embodiment, FIG. 1

FIG. 1 is a conceptual schematic block diagram showing a preferred type of resonance attenuation filter according to this invention. This arrangement may be characterized as a closed servo loop satisfying the following expression in equation 1:

$$C/R = (KA + KF(S))/[(1 + KF(S))] \quad \text{Equation 1}$$

Here:
A is the Gain of Amplifier A.
K is an "Elliptic Notch Filter" function.
F(S) is the corrector (D.C. offset corrector) function.

It will be understood that this feedback is intended to operate to make output C essentially the same (same DC voltage) as that appearing at input R. (Input R from the servo track-following system, and ultimately from the head itself picking up signals from the tracks).

Stage A is an amplifier with appropriate DC gain and is coupled between input R and a prescribed first summing point node SP-1. The output from SP-1 is applied to an elliptical filter block K (e.g., as implemented below). This may comprise a commercially-available unit (e.g., MF-10, below) or a pair of such, cascaded. These will be understood to attenuate deleterious resonances, as indicated, for instance, in the multi-notch pattern in FIG. 1A. The output from filter block K is fed to the servo loop output C as well as in a feedback loop to a second summing point SP-2 where it is algebracially combined with input signal R. The difference is applied as an error signal e to an integrator block [see F(s)] DS, adapted to process error signal e [Signal e=C−R.] Integrator DS comprises a special "low DC-offset" OP-amp as prescribed below, functioning as a low frequency integrator with-K/S response, also having high DC gain to effect a correction of the DC offset signal.

Figure 1A:
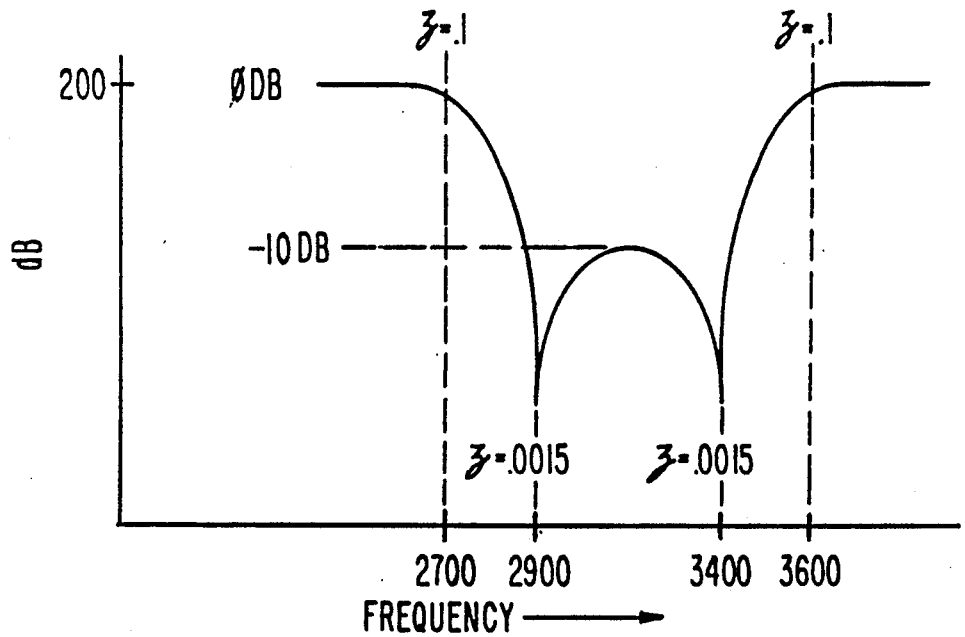
FIG. 1A shows a multi-notch pattern of a notch-filter of FIG. 1.
Figure 3:
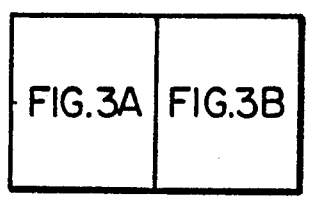
FIG. 3 shows the connecting arrangement of FIGS. 3A and 3B.

The desired operation of the "switched-capacitor" filter means K in FIG. 1 is to function as a "fourth-order, elliptic, notch filter"; it may be better understood from consideration of the plot of gain (dB) vs. frequency in FIG. 1A (note: Z denotes damping factor). It will be presumed that the system is to provide a minimum gain (e.g., −10 dB) reduction in the region of known head-arm resonance frequencies; here particularly at about 3.2 and 4.3 KHz (for contemplated drive), as indicated for the notch peaks in FIG. 1. Workers will recognize that this filter is designed to provide minimum phase-shift at the servo "open loop gain crossover frequency" (note below re FIGS. 3 and 4 also).

Figure 2:
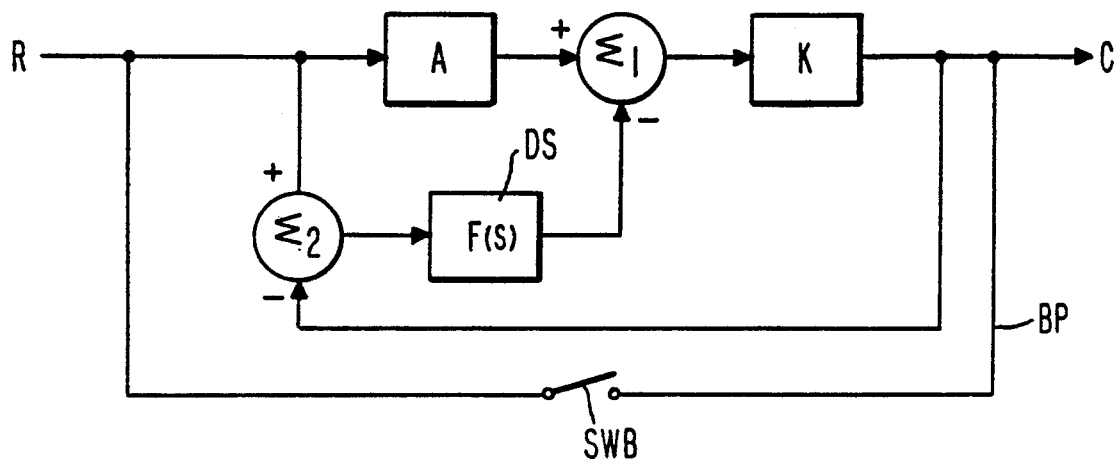
FIG. 2 shows a modification of FIG. 1.

Modification, FIG. 2

FIG. 2 represents the same kind of resonance attenuation filter system as in FIG. 1, with all elements the same except where otherwise specified. However, the system in FIG. 2 is modified by inclusion (dotted line) of a bypass line BP directly between input R and output C and including electronic switch SWB adapted to selectively bypass the filter when the servo is in "seek" to a new track.

Figure 3C:
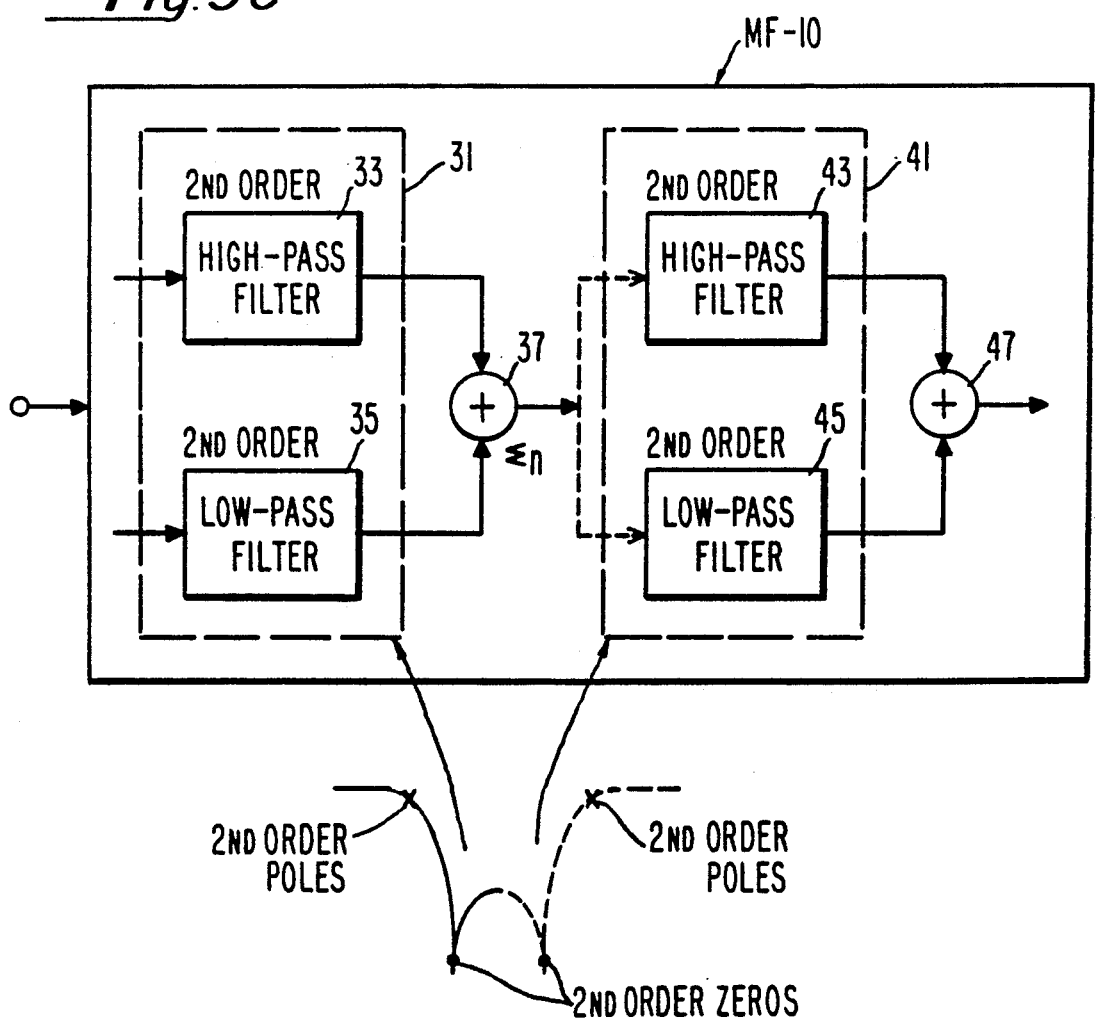
FIG. 3C shows a stage of FIGS. 3A–3B in detail.
Figure 3A:
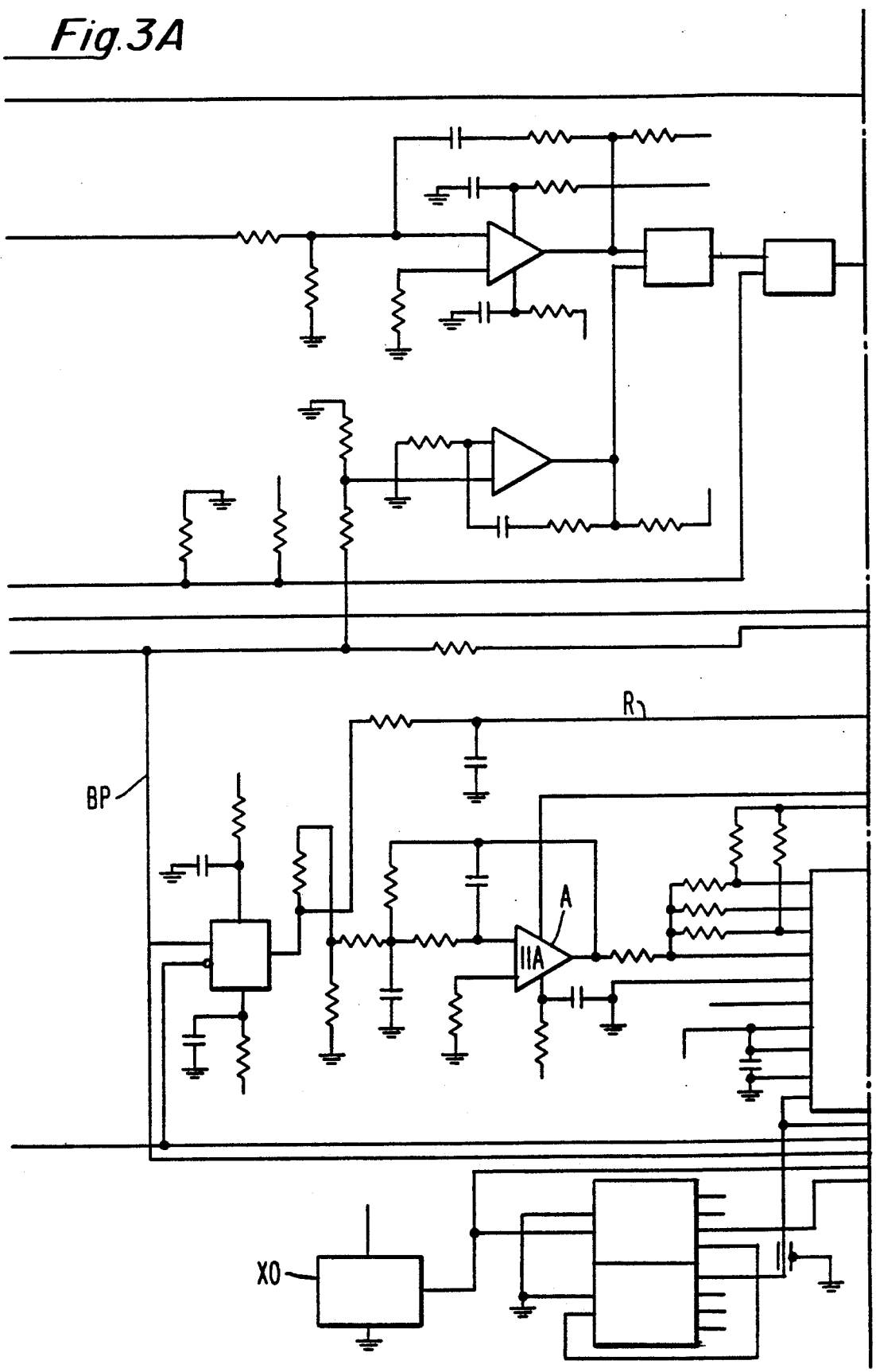
FIGS. 3A and 3B show a schematic of a preferred implementation of FIG. 1 or FIG. 2.
Figure 3B:
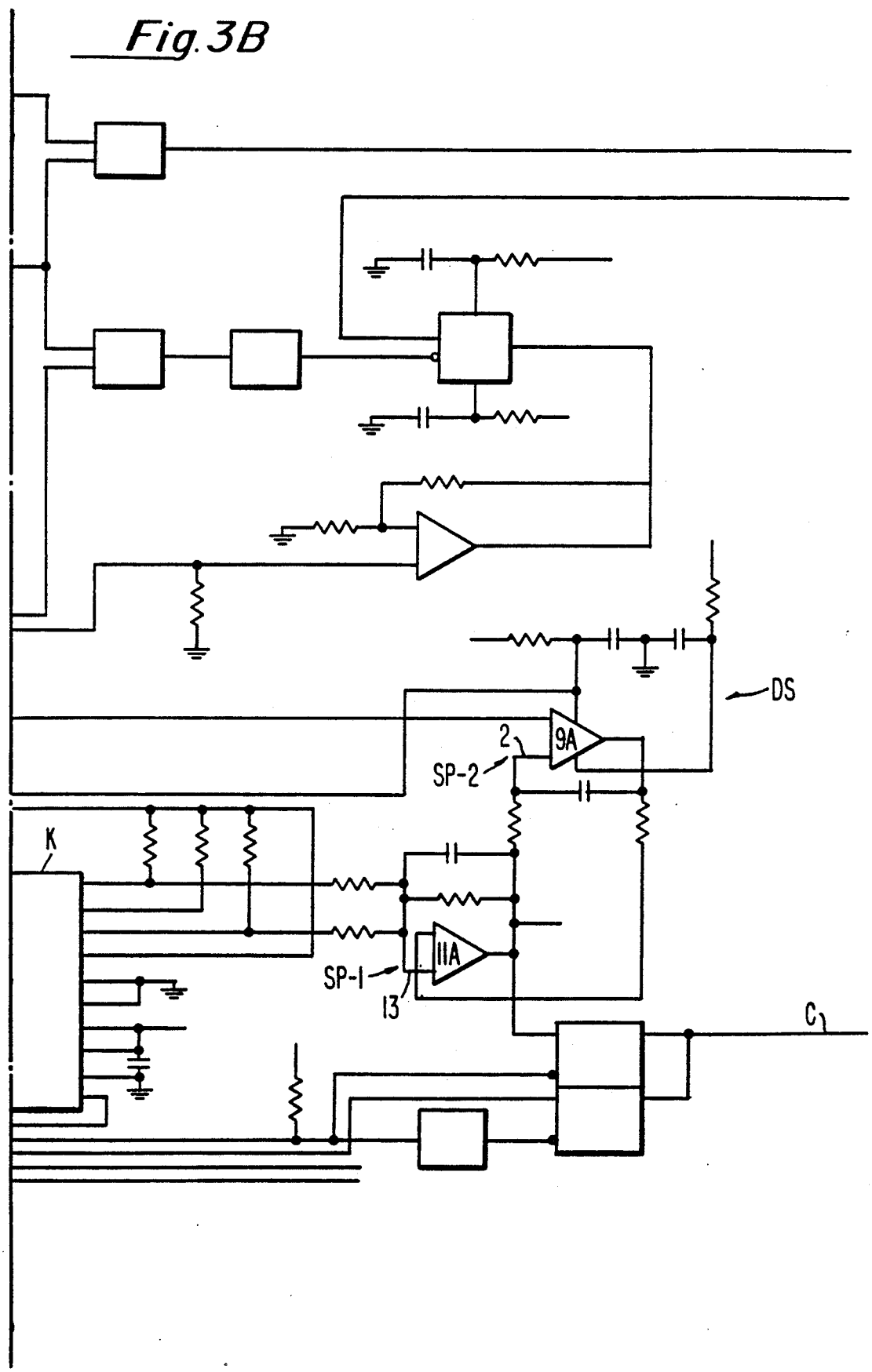

Particular Implementation, FIGS. 3A-3B

FIGS. 3A-3B indicate a preferred implementation of the system depicted in FIGS. 1 and 2 and the implementation of FIGS. 3A-3B represent a means of electronically forming (producing) a "double-notch-filter". This is a "fourth-order" system.

Here, the switched-capacitor filter K will be understood as used in a feed-back (servo) loop controlling the positioning of a disk drive head means. Without such a filter, resonances in the disk-drive mechanism can cause the servo-system to be unstable and oscillations can occur which could cause the positioning loop to go out of control. With the filter, the position servo system is stable in the presence of a known mechanical resonance. The complex poles and zeros of the filter are set to provide for a minimum phase shift. The depth of the filter is arranged to attenuate a mechanical resonance which typically appears in a disk-drive servo. Filter K is implemented by an off-the-shelf unit MF10 by National Semiconductor Company. The input amplifier stage A will be seen at 11A and the integrator DS will be seen at amplifier 9A, with the summing point SP-1 found at amplifier 11A (input 13) and the summing node SP-2 at the input 2 to amplifier 9A. Bypass BP (as in FIG. 2) is also noted. Workers will also note that a crystal oscillator XO (10 MHz) is inputted to a digital frequency divider unit VD. Crystal oscillator XO is intended to operate as a stable master clock source determining frequency tolerance as workers in the art will understand, its output being conventionally employed (frequency is subdivided by the divider VD as known in the art).

Workers will also understand that some modifications may be made in the FIGS. 3A-3B arrangement; for instance, instead of one switched-capacitor filter MF10 characterized by a single frequency, a pair of such filters MF10 may be provided in cascade, each fitted to remove a different range of resonance frequencies. Workers will appreciate that external capacitances are not required for this filter.

More particularly, switched capacitor filter stage MF10 (K in FIGS. 1, 2) may be somewhat simplistically represented, as in FIG. 3A, by a pair of dual filter stages, connected in parallel. That is, stage 31 is coupled to summing node 37 whose output is applied to stage 41, with the output of 41 appearing at associated node 47. Each stage 33, 35 and 43, 45 will be understood as comprising a "second-order, high-pass filter" in parallel with a "second-order, low-pass filter", both feeding a common associated summing point. Each filter is designed to attenuate a prescribed different resonance frequency, of a disk drive, as indicated in the FIGS. 3A-3B sketch. Thus, stage 31 comprises "second order high-pass filter" 33 connected in parallel with "second order low-pass filter" 35, both inputting to summing node 37 whose output is applied to stage 41 in parallel with "second order high-pass filter" 43 and "second order low-pass filter" 45 whose outputs are summed at node 47.

Results

The resulting resonance attenuation filter will be observed as exhibiting high stability and allowing DC offset correction, as also exhibiting exceptionally few "external components" (e.g., with no external capacitors required, vs. the prior art, as mentioned above) and is able to accommodate multiple resonance frequencies (multiple notches) without needing multiple OP-amps.

Workers will see that in this filter arrangement, the poles and zeros can be independently set (frequency plot) and provide filtration with a rather high quality (Q tolerance about 4% for instance, giving a rather steep dB profile to the resulting notch filtration, note FIG. 1A) with a frequency tolerance on the order of ±2%, according to the stability of the clock source and the external resistors.

Figure 6A:
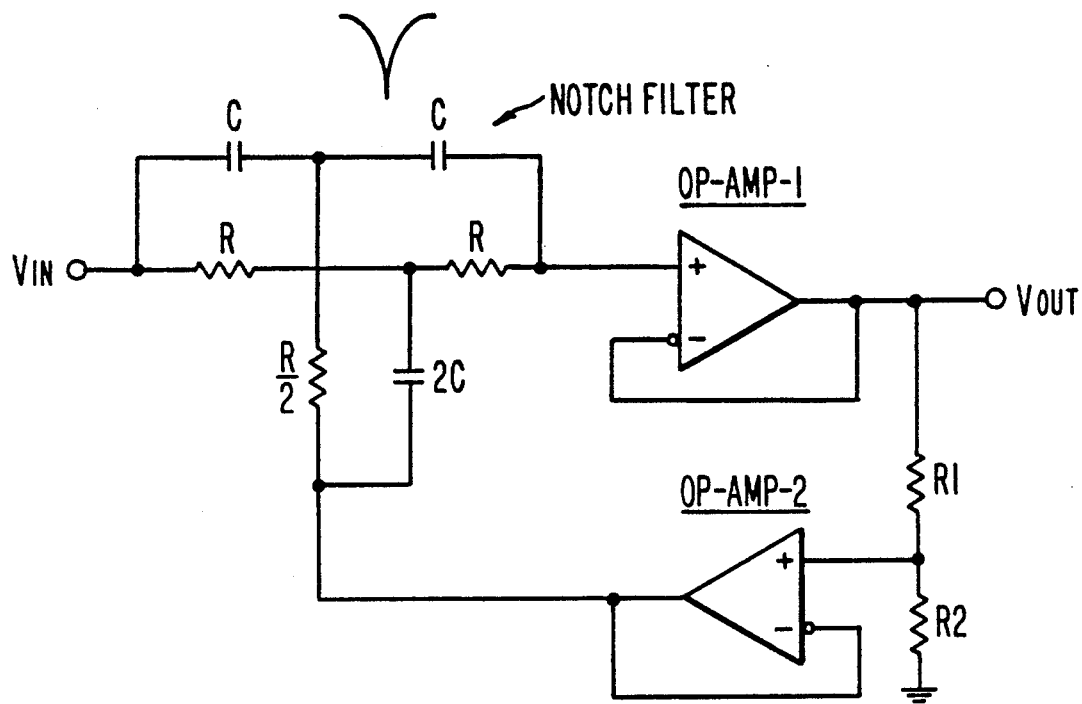
FIG. 6A depicts a conventional filter.
Figure 6B:
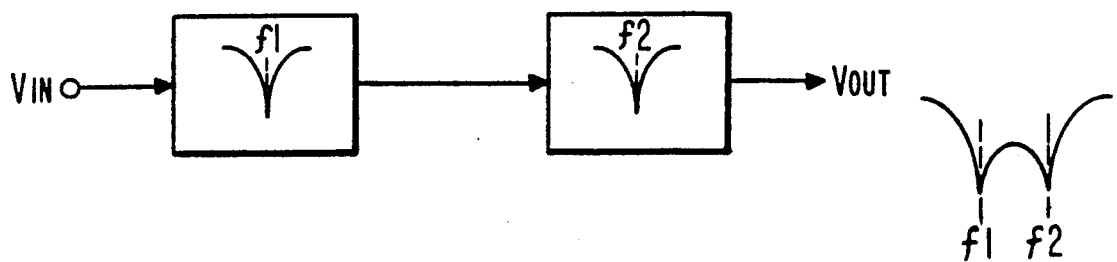
FIG. 6B shows the result of using tow conventional filters.
Figure 7:
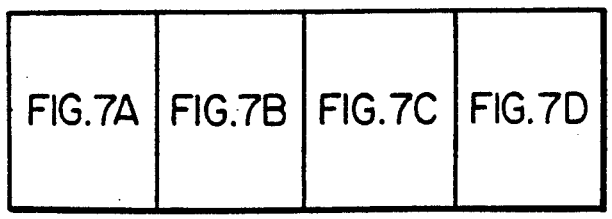
FIG. 7 shows the connecting arrangement of FIGS. 7A to 7D.
Figure 7A:
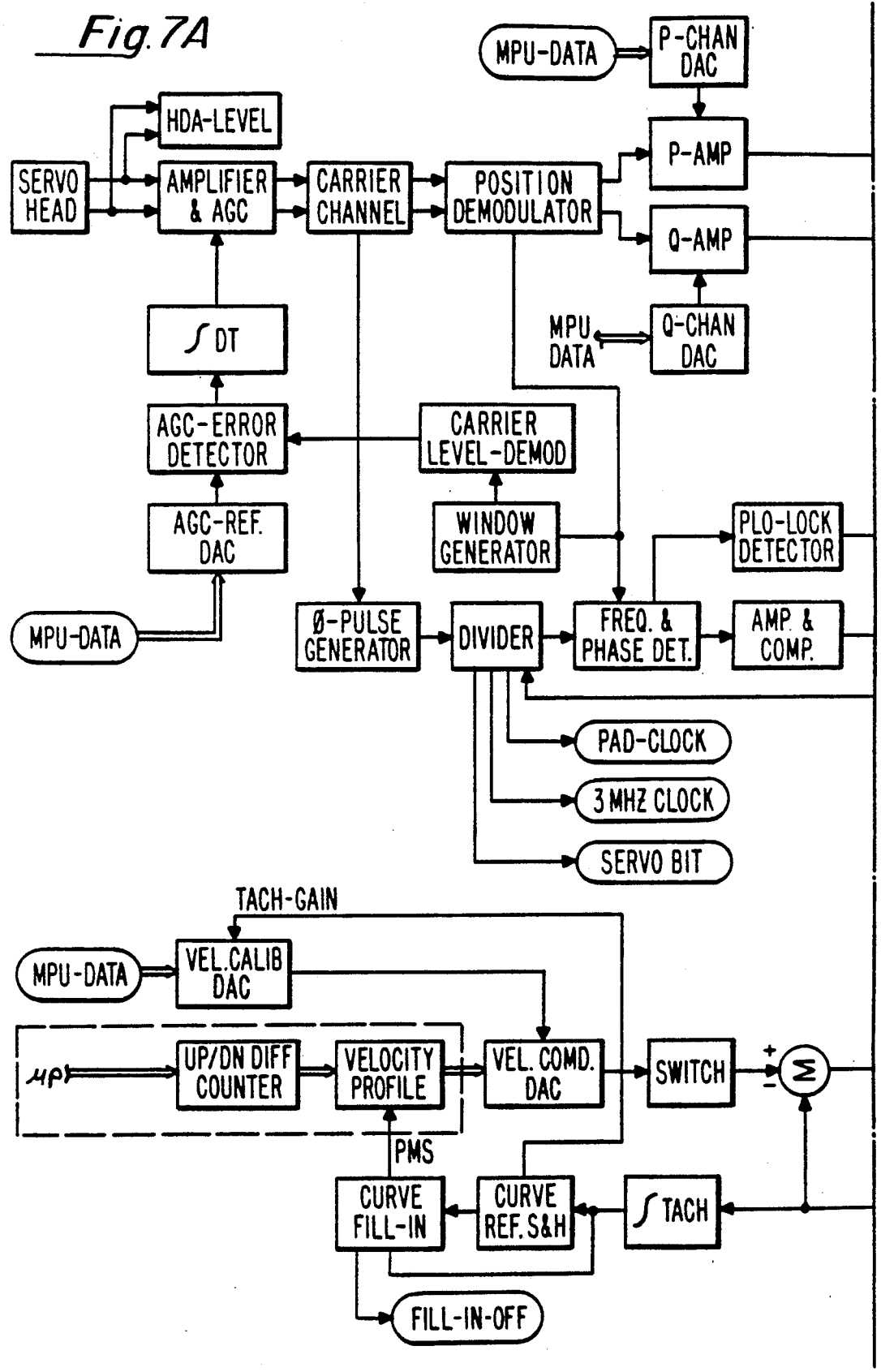
Figure 7D:
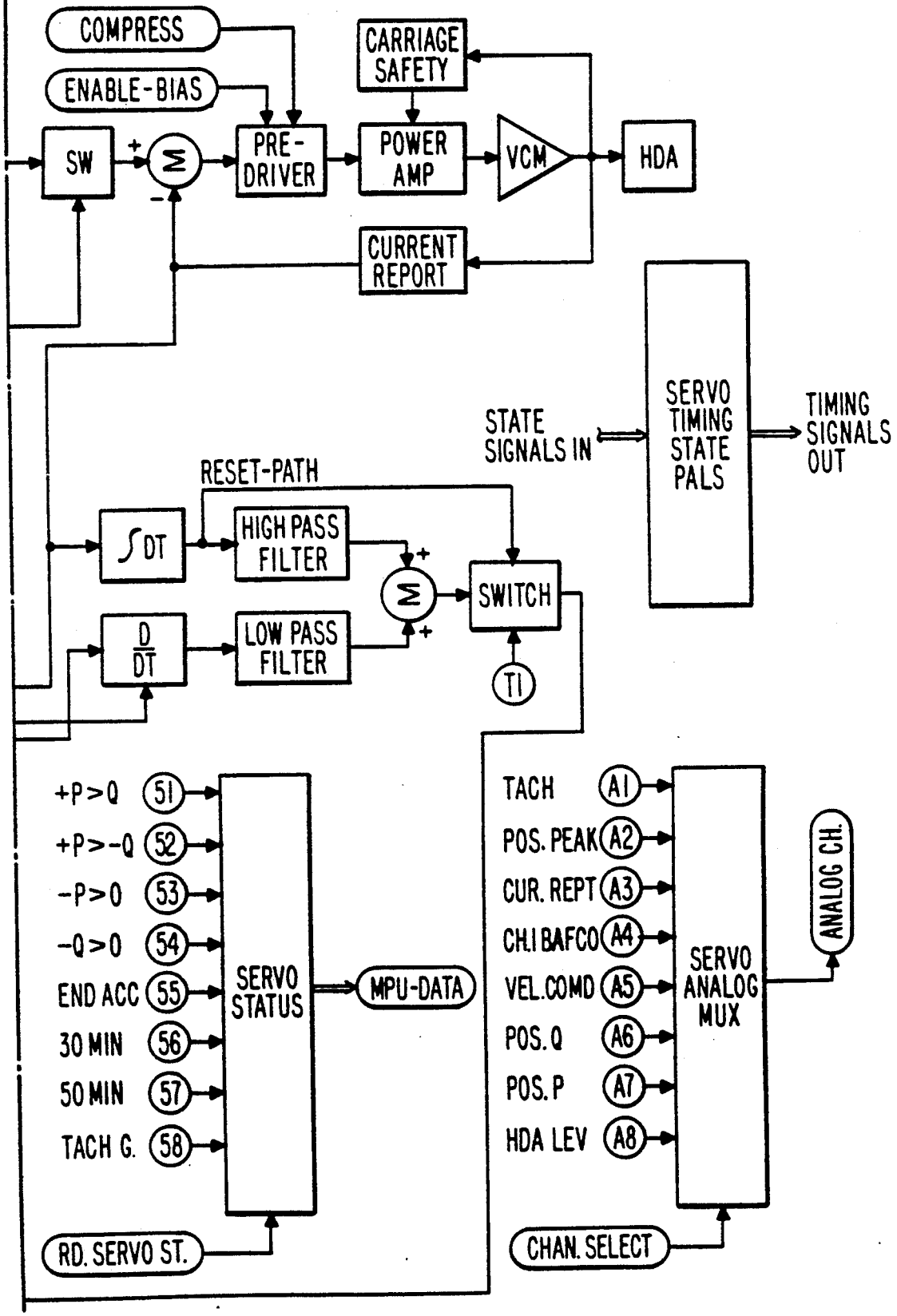

This filter system can be considered as functionally equivalent to a comparable analog filter. In fact, workers will realize how favorably the subject filter compares with conventional analog filter means such as that shown in FIGS. 6A, 6B.

There are limitations to the advantages derived with the subject filter; for instance, DC offset generated by the subject filter, must be corrected by a feedback loop around the filter block K to remove the DC component generated within K.

Figure 4:
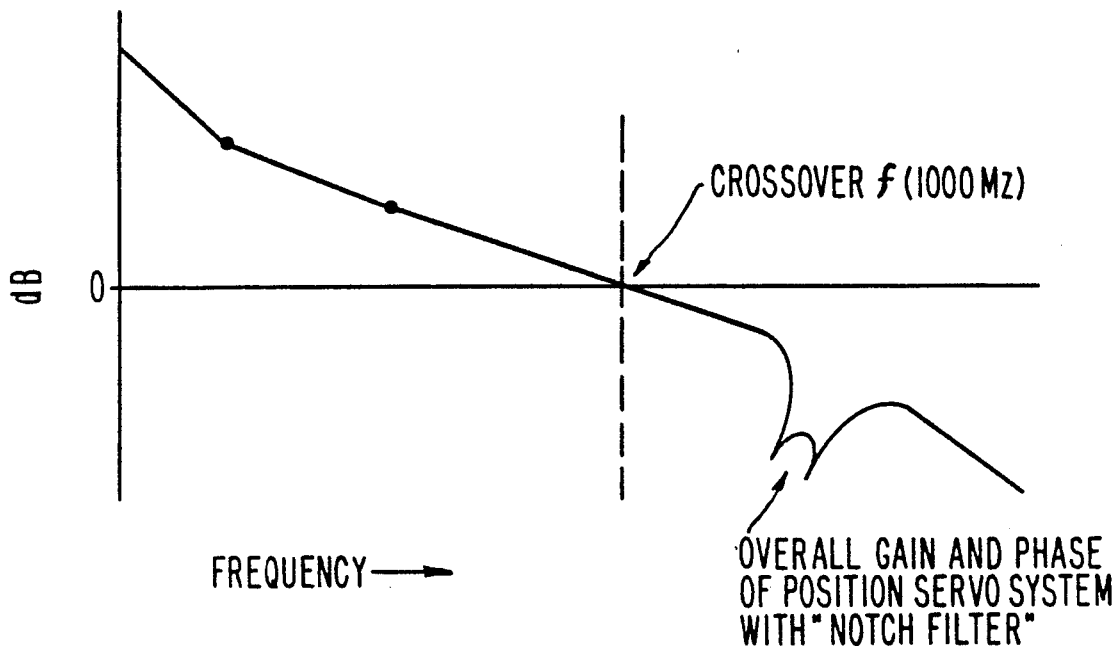
FIG. 4 plots a gain versus frequency to indicate results achieved by present invention.
Figure 5:
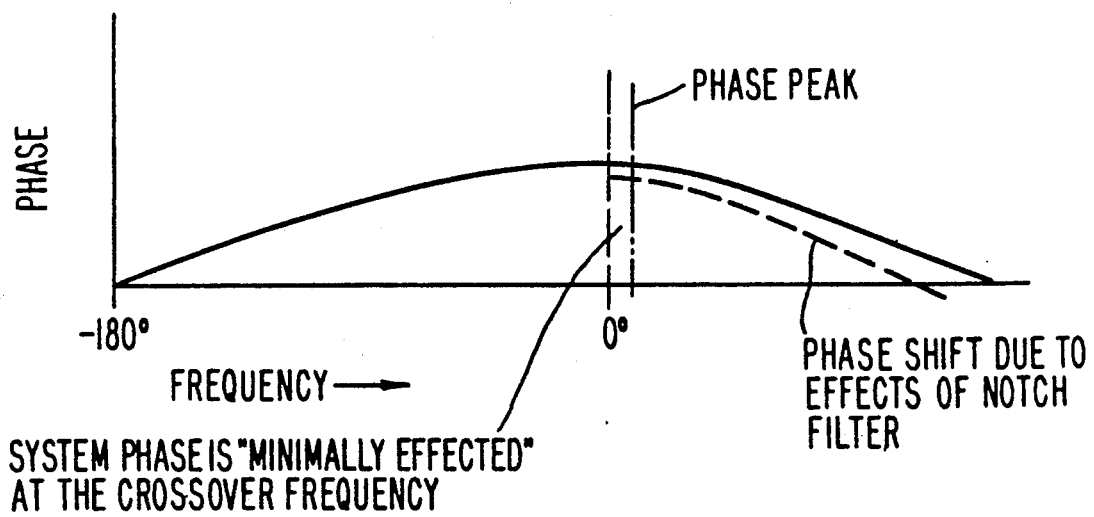
FIG. 5 plots a phase versus frequency to indicate results achieved by present invention.

Features of the invention may be further understood by consideration of FIGS. 4 and 5. FIG. 4 is a plot of gain (dB) vs. frequency and may be understood as exhibiting a "crossover frequency" at a prescribed point, for instance 1 KHz assumed here. The comparable plot in FIG. 5 of phase vs. frequency will indicate that, as desired, the system will exhibit a minimum phase shift influence at this 1 KHz "gain crossover frequency" for the open-loop servo due to the presence of the notch filter.

Conclusion

It will be understood that the preferred embodiments described herein are only exemplary, and that the invention is capable of many modifications and variations in construction, arrangement and use without departing from the spirit of the invention.

Further modifications of the invention are also possible. For example, the means and methods disclosed herein are also applicable to other high density disk files, as well as to related servo systems. Also, the present invention is applicable for providing filter means for other related applications.

The above examples of possible variations of the present invention are merely illustrative. Accordingly, the present invention is to be considered as including all possible modifications and variations coming within the scope of the invention as defined by the following appended claims.

What is claimed is:

1. A disk drive positioning arrangement apt to be disturbed by resonant vibrations, this arrangement including a closed loop servo system with a "switched-capacitor" digital filter capability using filter means, which filter means is selected and arranged to attenuate resonant vibration and enhance the stability of the closed loop servo system for the disk drive positioning arrangement; said servo system comprising:
   a prescribed amplifier means A;
   an elliptical, switched-capacitor digital filter means K, wherein the amplifier means A and the filter means K are connected in series to form a series circuit, which series circuit is connected between an input stage R and an output means C:
   a first summing means SP-1 connected between the amplifier means A and the filter means K;
   a first integrator means I disposed in feedback relation with the filter means K;
   a second summing means SP-2 connected in parallel with said series circuit and connected between R and C; and
   a second integrator means DS connected between the summing means SP-1 and SP-2.

2. The arrangement of claim 1, wherein said filter means K has second-order low-pass outputs and second-order high-pass outputs, said second-order low-pass outputs being summed with said second-order high-pass outputs to form a fourth-order, elliptic, multi-notch filter.

3. The arrangement of claim 1, wherein said filter means K exhibits multi-notch capability without requiring a filter for each notch.

4. The arrangement of claim 1, including a feedback loop means for correcting DC-offset from said filter means K.

5. The arrangement of claim 1, wherein said filter means K is operatively associated with a master clock means adapted to enhance the system stability.

6. The arrangement of claim 1 wherein said filter means K is arranged to minimize phase shift at a servo frequency where "open-loop gain crossover" occurs.

7. A disk drive positioning arrangement apt to be disturbed by resonant vibrations, this arrangement including a closed loop servo system with a "switched-capacitor" digital filter capability using filter means, which filter means is selected and arranged to attenuate resonant vibration and enhance the stability of the closed loop servo system for the disk drive positioning arrangement; said servo system comprising:
   a prescribed amplifier means A;
   an elliptical switched-capacitor digital filter means K, wherein the amplifier means A and the filter means K are connected in series to form a series circuit, which series circuit is connected between an input stage R and an output means C; and
   feed-back loop means for said filter means K, said feed-back loop means being adapted to correct DC-offset from said filter means K.

8. The arrangement of claim 7, wherein said filter means K has second-order low-pass outputs and second-order high-pass outputs, said second-order low-pass outputs being summed with said second-order high-pass outputs to form a fourth-order, elliptic, multi-notch filter.

9. The arrangement of claim 7, wherein said filter means K exhibits multi-notch capability without requiring a filter for each notch.

10. The arrangement of claim 7, wherein said filter means K is operatively associated with a master clock means adapted to enhance the system stability.

11. The arrangement of claim 7, wherein said filter means K is arranged to minimize phase shift at a servo frequency where "open-loop gain crossover" occurs.

* * * * *